(12) United States Patent
Rogado et al.

(10) Patent No.: US 7,477,131 B2
(45) Date of Patent: Jan. 13, 2009

(54) LOW TEMPERATURE COEFFICIENT OF RESISTIVITY POLYMERIC RESISTORS BASED ON METAL CARBIDES AND NITRIDES

(75) Inventors: Nyrissa S. Rogado, Wilmington, DE (US); Munirpallam Appadorai Subramanian, Kennett Square, PA (US)

(73) Assignee: E.I. Du Pont De Nemours, Wilmington, DE (US)

( * ) Notice: Subject to any disclaimer, the term of this patent is extended or adjusted under 35 U.S.C. 154(b) by 112 days.

(21) Appl. No.: 11/517,734

(22) Filed: Sep. 7, 2006

(65) Prior Publication Data

US 2008/0061273 A1  Mar. 13, 2008

(51) Int. Cl.
*H01K 7/00* (2006.01)
*H01K 7/118* (2006.01)
*H01B 1/06* (2006.01)

(52) U.S. Cl. ................ 338/22 R; 252/504; 252/516
(58) Field of Classification Search ............ 252/504, 252/511, 516; 338/22 R
See application file for complete search history.

(56) References Cited

U.S. PATENT DOCUMENTS

| 3,912,668 | A | * | 10/1975 | Neumann et al. ........... 252/511 |
| 4,076,652 | A | * | 2/1978 | Ganci et al. .................. 252/504 |
| 4,601,848 | A | | 7/1986 | Sakai et al. |
| 4,732,701 | A | | 3/1988 | Nishii et al. |
| 5,106,538 | A | * | 4/1992 | Barma et al. ................. 252/511 |
| 6,063,463 | A | | 5/2000 | Schlueter, Jr. et al. |
| 6,396,384 | B1 | * | 5/2002 | Blok et al. ................. 338/22 R |
| 6,620,343 | B1 | * | 9/2003 | Blok et al. ................... 252/511 |
| 2003/0035956 | A1 | * | 2/2003 | Hisashi et al. .............. 428/408 |
| 2003/0111648 | A1 | | 6/2003 | Chu et al. |

FOREIGN PATENT DOCUMENTS

WO  WO 01/09905 A2  2/2001

OTHER PUBLICATIONS

Shrout et al "Composite PTCR thermistors utilizing conducting borides, silicides and carbide powders", Journal of Materals Science 26(1991) 145-154.*
International Search Report Dated May 23, 2007, International Application No. PCT/US2006/034516, International Filing Date: Sep. 7, 2006.

* cited by examiner

*Primary Examiner*—Mark Kopec
(74) *Attorney, Agent, or Firm*—Gail D Tanzer

(57) ABSTRACT

Provided are compositions containing 20 to 50% by volume of a nitride or carbide of a group IV metal, a polymer, and 1 to 9% by volume of an allotrope of carbon. The compositions are useful in manufacturing resistors with low temperature coefficients of resistivity.

6 Claims, No Drawings

LOW TEMPERATURE COEFFICIENT OF RESISTIVITY POLYMERIC RESISTORS BASED ON METAL CARBIDES AND NITRIDES

FIELD OF THE INVENTION

This invention provides compositions of metal carbides and nitrides useful in the printing of electronic device resistors that have low temperature coefficients of resistance.

BACKGROUND OF THE INVENTION

The demand for high-density and high-speed performance in smaller, more portable electronic devices is ever increasing. Embedded passives comprise a type of Printed Circuit Board (PCB) design that combines better performance in smaller boards with increased functionality by burying resistors or capacitors, i.e. passive devices, in the substrate material itself.

In particular, important performance requirements for making PCBs having embedded resistors operating in the 100 Ohms to 1 mega-Ohm range include a balanced Temperature Coefficient of Resistance ["TCR"] and resistive stability. However, new materials are required since current materials satisfy neither the performance nor fabrication requirements for routine manufacture of embedded passives in PCBs.

Previously, most low TCR resistors consisted of lead- and/or ruthenium-based materials as conductive fillers. Governmental regulations spurred by environmental concerns are eliminating lead from electronic devices, whereas ruthenium is too costly a precious metal for use in high performance resistors.

To compensate current resistors use graphite and metal powders, which are sufficient only for the low resistance range, that is, less than 100 Ohms, and therefore do not achieve the desired resistance operating range. Moreover, those resistors having only graphite as conductive filler tend to have large, negative TCRs in the high resistance range. Neither kind of resistor is satisfactory in performance or material.

Sakai et al (U.S. Pat. No. 4,601,848 A) describe resistor compositions comprising a glass, an inorganic aggregate, carbon black and a reducing metallic powder.

Nishii et al (U.S. Pat. No. 4,732,701 A) describe polymer compositions having positive temperature coefficients comprising a polymer, an electrically conductive powder and a semiconductive inorganic substance.

Chu et al (US 20030111648 A1) describe a resistor composition comprising a polymer, at least one conductive filler and a coupling agent.

The present invention provides compositions comprising titanium nitride or titanium carbide or other nitrides or carbides of group IV elements, an allotrope of carbon, and a polymer binder.

SUMMARY OF THE INVENTION

One aspect of the present invention is a composition comprising:
  a) 20 to 50% by volume TiN, based on the total volume of the composition;
  b) a polymer; and
  c) 1 to 9% by volume of an allotrope of carbon.

Another aspect of the present invention is a composition consisting essentially of:

a) 20 to 50% by volume of a nitride or carbide of a group IV metal, based on the total volume of the composition;
  b) a polymer; and
  c) of 1 to 9% by volume of an allotrope of carbon.

A further aspect of the present invention is a composition consisting essentially of:
  a) 20 to 50% by volume of TiC, based on the total volume of the composition;
  b) a polymer; and
  c) 1 to 9% by volume of an allotrope of carbon.

DETAILED DESCRIPTION

DEFINITIONS

As used herein, a group IV metal carbide or nitride is defined as a compound with the chemical formula $A_xB_y$, where A pertains to any group IV metal and/or their mixtures, and B is C or N.

As used herein, the term "carbon allotrope" or "allotrope of carbon" includes graphite or carbon black, or amorphous carbon. As is known to those skilled in the art, carbon occurs in several forms (allotropes), including carbon black, diamond, graphite, and several amorphous forms.

As used herein, "low temperature coefficient of resistance" refers to a change in resistance with increasing or decreasing temperature equivalent to 0+/−500 ppm/° C.

As used herein, an "inert filler" is a filler that is an electrical insulator and does not chemically interact with a composition in which it is contained, and includes, for example, talc, quartz, alumina and mixtures thereof.

As used herein, an "FR4 substrate" is a laminate material produced from glass-woven fabric impregnated with an epoxy resin binder and subjected under high pressure to form sheets.

ABBREVIATIONS

C Carbon
N Nitrogen
Ti Titanium
TCR Temperature Coefficient of Resistance
PCB Printed Circuit Board
CV Coefficient of Variance
DSDA bis (3,4-dicarboxyphenyl) sulfoxide dianhydride
TFMB 4,4'-diamino-2,2'-bis(trifluoromethyl)biphenyl
HAB 3,3'-dihydroxy-4,4'-diaminobiphenyl
ESD electrostatic discharge
SEM Scanning Electron Microscope
6-FDA 2,2-bis-(3,4-dicarboxyphenyl) 1,1,1,3,3,3-hexafluoropropane dianhydride
6F-AP 2,2-bis-(3-amino-4-hydroxyphenyl) hexafluoropropane The compositions disclosed herein are useful for making low TCR polymeric resistors employed for as embedded passives in a PCB.

Offering a compromise between size, cost and performance of electronic devices, embedded passive devices are buried in the substrate material of the PCB, rather than mounted on the surface of the board. Thus, the passives take up no "real estate" on the board surface, enabling a smaller-sized PCB. Importantly, in lying directly underneath the integrated circuit, an embedded passive has shorter leads and lower inductance, which results in improved electrical performance. Plus, embedded passives have no solder joints, resulting in greater reliability and reduced amounts of lead.

An embedded resistor composition is desirably a lead-free composition owing to environmental concerns and a ruthenium-free composition owing to cost considerations. Fabrication of the embedded resistors should also be compatible with existing PCB processes, e.g. they can be made into screen printable pastes using established solvents. Other desirable properties include good adhesion-to copper and dielectric substrates and prepreg lamination stability. Performance targets for resistors in the 100 Ohms to 1 mega-Ohm range include balanced Temperature Coefficient of Resistance, that is, less than +/−500 ppm/° C., and resistive stability, that is, less than 5% drift, with thermal cycling, electrostatic discharge (ESD) and 85/85 tests.

The compositions disclosed herein comprise certain metal carbides or nitrides and a carbon allotrope, such as graphite. These are added to a polymer matrix to form a resistive paste cured at low temperatures, typically less than 250° C. These materials are unstable in air at high temperatures (for example greater than 400° C.) which makes them suitable to use as conductive fillers in polymeric resistors, which do not require high curing temperatures. In particular, the compositions have properties, as disclosed above, that make them desirable for use as polymeric resistors embedded in printed wiring boards.

The compositions disclosed herein exhibit a low temperature coefficient of resistance. Their stable resistive properties make possible embedding polymeric resistors of these compositions in PCBs that are highly reliable.

In these compositions, a polymer matrix is mixed with about 1 to about 9% by volume of a carbon allotrope, such as graphite or carbon black, and about 20 to 50% by volume of a conductive metal carbide or nitride.

The polymer matrix can be selected from, for example, crosslinkable, low moisture-absorbing polymers that are soluble in conventional screen-printing paste solvents. Examples of suitable matrix polymers include polyimides, epoxy-containing polyimides, polynorbornenes, epoxy-containing polynorbornenes, phenoxy resins, polyarylates, polysulfones, polyhydroxystyrenes, and polycarbonates. To the composition may optionally be added inert inorganic fillers, such as alumina, talc or quartz, commercially available at least from Aldrich and comprising about 10 to about 20% by volume of the composition. Printed 40 mil and 60 mil resistors, approximately 20 microns thick, show resistances (in Ohms/square) ranging from $10^2$ to $10^5$ with low TCR (less than or equal to +/−500 ppm/° C.).

The resulting paste undergoes 3-roll milling until a fineness of grind ["FOG"] that is less than 5 microns is obtained. The paste is printed using a 180 - or 230 -mesh screen on an FR4 substrate with Copper ["Cu"] terminations. The paste is cured at about 170 ° C. for about 1 hour followed by a heat bump at about 230 ° C. for two minutes.

EXAMPLES

On all samples, resistance and TCR were measured, followed by 85/85, thermal cycling and ESD tests. Resistance measurements at room temperature were performed using a two-probe method with a Keithley meter. The coefficient of variance (CV) was calculated as a measure of resistance reproducibility. The TCR was obtained from the difference in the measured resistances at 125° C. and at room temperature (HTCR) and the difference in the measured resistances at room temperature and at −55° C. (CTCR). The 85/85 test, also known as the high pressure cooker test, was performed by exposing the resistors to environmental conditions at 85° C. and 85% relative humidity for 100 hours. The thermal cycling test was done by putting the resistors through 60 cycles of changing temperature between −25° C. and 125° C. The ESD test was conducted by applying a 2000 V pulse through the resistor. The resistors typically exhibited very small change in resistance following these tests.

Both commercially available and synthesized carbide and nitride materials can be used as conductive fillers. Commercially available powders to be incorporated into the compositions may be purchased from a supplier such as Aldrich, Fisher, or Alfa. The "as received" powders typically have 2 micron mean particle size. The conductive powder materials undergo a pre-milling process before they are mixed with the polymer to form the resistor paste. The "pre-milled" powders have mean particle sizes less than 1 microns as determined by particle size distribution measurements.

Examples 1-12

Table 1 is a chart of the measured resistances at room temperature and TCRs between −55° C. (CTCR) and 125° C. (HTCR) for selected resistor compositions. Inert fillers such as talc, quartz or alumina have also been added but are not specifically indicated in the composition.

Polymer 1 is a crosslinked polyimide consisting of bis (3,4-dicarboxyphenyl) sulfoxide dianhydride (DSDA), phthalic anhydride, 4,4'-diamino-2,2'-bis(trifluoromethyl)biphenyl (TFMB), and 3,3'-dihydroxy-4,4'-diaminobiphenyl (HAB). Polymer 1 is described in US patent application 2005/0154181 Polymer 2 is a proprietary fluorinated crosslinked polyimide consisting of 2,2-bis-(3,4-dicarboxyphenyl) 1,1,1, 3,3,3,-hexafluoropropane dianhydride (6-FDA), phthalic anhydride, TFMB, and 2,2-bis-(3-amino-4-hydroxyphenyl) hexafluoropropane (6F-AP). Polymer 2 also contains an epoxy, RSS-1407 from Resolution Performance Products, and N,N-dimethylbenzylamine as catalyst. Polymer 2 is described in U.S. patent application Ser. No. 11/248803. These polyimides were prepared by reacting a suitable dianhydride (or mixture of suitable dianhydrides, or the corresponding diacid-diester, diacid halide ester, or tetracarboxylic acid thereof) with one or more selected diamines. The mole ratio of dianhydride component to diamine component is preferably from between 0.9 to 1.1. Preferably, a slight molar excess of dianhydrides can be used at mole ratio of about 1.01 to 1.02. End capping agents, such as phthalic anhydride, can be added to control chain length of the polyimide. Sterically hindered hydrophobic epoxies are also added to provide resistance to moisture absorption of the cured embedded resistors. In one embodiment of the present invention an amount of epoxy component found to be useful, in relationship to the amount of polyimide component, can be expressed by the following ratio A:B where A is the polyimide component and B is the epoxy component, and where A is between, and including, any two of the following numbers 1, 2, 3, 4, 5, 10,12 and 15, and where B is 1.0. An appropriate organic solvent is also selected that can easily dissolve the polyimide component and which can be boiled off (later in processing) at a relatively low operating temperature. Solvents known to be useful include organic liquids having both (i.) a Hanson polar solubility parameter between and including any two of the following numbers 2.1, 2.2, 2.3, 2.4, 2.5, 2.6, 2.7, 2.8, 2.9 and 3.0, and (ii) a normal boiling point ranging from between and including any two of the following numbers 210, 220, 230, 240, 250 and 260° C. In one embodiment of the present invention, a useful solvent is selected from one or more dibasic acid ester solvents including, but not limited to, DuPont DBE® solvents including dimethyl succinate, dimethyl glutarate and dimethyl adipate.

Other useful solvents include propyleneglycol diacetate (PGDA), Dowanol® PPh, butyl carbitol acetate, carbitol acetate and mixtures of these. Cosolvents may be added provided that the composition is still soluble, performance in screen-printing is not adversely affected, and lifetime storage is also not adversely affected.

TABLE 1

| Examples | Composition | Volume % | R Ohms | HTCR ppm/° C. | CTCR ppm/° C. |
|---|---|---|---|---|---|
| 1 | TiN/polymer 1 | 38.7/46.3 | 2,300 | 3,956 | 2,345 |
| 2 | TiN:Carbon black/ polymer 2 | 34.7:4.0/ 46.23 | 10,800 | 508 | 374 |
| 3 | Pre-milled TiN:Carbon black/ polymer 2 | 34.7:4.0/ 46.23 | 150,200 | −103 | −503 |
| 4 | Pre-milled TiN:Carbon black/ polymer 2 | 34.7:6.0/ 46.23 | 9,000 | −43 | −255 |
| 5 | TiC/polymer 1 | 38.7/46.3 | 2,500 | 4,472 | 2,363 |
| 6 | TiC:Carbon black/ polymer 2 | 34.7:4.0/ 46.23 | 24,500 | 1,680 | 1,570 |
| 7 | Pre-milled TiC:Carbon black/ polymer 2 | 38.7:4.0/ 46.23 | 68,300 | 946 | 319 |
| 8 | Pre-milled TiC:Carbon black/ polymer 2 | 38.7:7.6/ 46.23 | 5,500 | 12 | −318 |
| 9 | Nano-TiC (Aldrich):Carbon black/ polymer 2 | 30.7/4.0/ 46.23 | 1,250 | 456 | 404 |
| 10 | Nano-TiC (Aldrich):Carbon black/ polymer 2 | 38.7/8.0/ 46.23 | 188 | 269 | 342 |
| 11 | ZrC:Carbon black/ polymer 2 | 34.7:4.0/46.23 | 181,000 | −562 | −1440 |
| 12 | ZrC:nano-TiC:Carbon black/ polymer 2 | 34.7:4.8:4.0/ 46.23 | 363,000 | 414 | −58 |

Compositions consisting of the metal carbides/nitrides and polymer alone have high resistance (>1,000 Ohms) and positive TCRs as shown by Examples 1 and 5. Comparison of Examples 1 and 2 shows that the addition of carbon particles to the TiN conductive phase system in the appropriate polymer matrix results in high resistance materials (>10,000 Ohms) with balanced TCRs (+/−500 ppm/° C.). Examples 2 and 3 consist of the same conductive/polymer composition. However, Example 3, which contains pre-milled, finer TiN particles, yields a higher resistance material than Example 2. Both examples give balanced TCRs. It is also shown that the resistance can be controlled, not only by modifying the particle size of the conductives by premilling to less than 1 micron particle size, but also by varying the amounts of carbon filler added to the paste, to give resistances as high as 100 kilo-Ohms. This is shown by Examples 3 to 4.

Similar properties are also observed in TiC conductive phase systems as shown by Examples 5 to 8. In addition, the use of TiC nanopowder from Aldrich results in low resistance (R≦1 kilo-Ohm) and positive TCR materials, which shows the possibility of fabricating resistor materials ranging from 100 Ohms to 100 kilo-Ohms using the TiC-carbon resistor paste compositions. Addition of the TiC nanopowder to a high resistance, negative TCR material such as ZrC results in an even higher resistance material with balanced TCRs as shown in Example 12.

What is claimed is:

1. A resistor comprising a composition consisting essentially of:
   a) 20 to 50% by volume a nitride or carbide of a group IV metal; based on the total volume of the composition;
   b) a polymer; and
   c) 1 to 9% by volume of an allotrope of carbon; wherein the polymer is selected from the group consisting of polyimides, epoxy-containing polyimides, polynorbornenes, epoxy-containing polynorbornenes, phenoxy resins, polyarylates, polysulfones, polyhydroxystyrenes, and polycarbonates, said resistor having a temperature coefficient of 0 +/− 500 ppm/° C.

2. The composition of claim 1, wherein the carbide of a group IV metal comprises TiC.

3. The composition of claim 1, wherein the carbide of a group IV metal comprises ZrC.

4. A resistor comprising a composition comprising:
   a) 20 to 50% by volume TiN based on the total volume of the composition;
   b) a polymer; and
   c) of 1 to 9% by volume of an allotrope of carbon; wherein the polymer is selected from the group consisting of polyimides, epoxy-containing polyimides, polynorbornenes, epoxy-containing polynorbornenes, phenoxy resins, polyarylates, polysulfones, polyhydroxystyrenes, and polycarbonates, said resistor having a temperature coefficient of resistance of 0+/− 500ppm/° C.

5. The composition of claim 4, further comprising 0.001 to 20% by volume of an inert filler, based on the total volume of the composition.

6. A resistor comprising a composition consisting essentially of:
   a) 20 to 50% by volume a nitride or carbide of a group IV metal based on the total volume of the composition;
   b) a polymer; and
   c) 1 to 9% by volume of an allotrope of carbon d) 0.001 to 20% by volume of an inert filler; wherein the polymer is selected from the group consisting of polyimides, polynorbornenes, phenoxy resins, polyarylates, polysulfones, polyhydroxystyrenes, and polycarbonates, said resistor having a temperature coefficient of resistance of 0+/− 500ppm/° C.

* * * * *